(12) United States Patent
Zampini et al.

(10) Patent No.: US 7,390,609 B2
(45) Date of Patent: Jun. 24, 2008

(54) POLYMERS AND PHOTORESISTS COMPRISING SAME

(75) Inventors: Anthony Zampini, Westborough, MA (US); Tao Zhang, Quincy, MA (US); Jaihyoung Lee, Daejeon (KR)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 169 days.

(21) Appl. No.: 10/793,427

(22) Filed: Mar. 3, 2004

(65) Prior Publication Data

US 2004/0248032 A1 Dec. 9, 2004

Related U.S. Application Data (60) Provisional application No. 60/451,580, filed on Mar. 3, 2003.

(51) Int. Cl.
- G03C 1/73 (2006.01)
- G03C 1/76 (2006.01)
- G03F 7/039 (2006.01)
- G03F 7/20 (2006.01)
- G03F 7/30 (2006.01)

(52) U.S. Cl. .............. 430/270.1; 430/326; 430/905; 430/907; 430/914; 430/271.1; 430/311

(58) Field of Classification Search .......... 430/270.1, 430/271.1, 272.1, 325, 326, 311
See application file for complete search history.

(56) References Cited

U.S. PATENT DOCUMENTS

| | | | |
|---|---|---|---|
| 2,986,548 A | 5/1961 | McLoughlin et al. | 524/319 |
| 3,389,114 A | 6/1968 | Burzynski et al. | 523/309 |
| 3,969,543 A | 7/1976 | Roberts et al. | 430/325 |
| 4,223,121 A | 9/1980 | Burzynski | 528/12 |
| 4,349,609 A | 9/1982 | Takeda et al. | 428/429 |
| 4,399,266 A | 8/1983 | Matsumura et al. | 528/10 |
| 4,745,169 A | 5/1988 | Sugiyama et al. | 528/43 |
| 5,100,503 A | 3/1992 | Allman et al. | 438/694 |
| 5,240,813 A | 8/1993 | Watanabe et al. | 430/280.1 |
| 5,547,808 A | 8/1996 | Watanabe | 430/176 |
| 5,612,170 A | 3/1997 | Takemura et al. | 430/270.1 |
| 5,691,396 A | 11/1997 | Takemura et al. | 522/62 |
| 5,731,126 A | 3/1998 | Takemura et al. | 430/270.1 |
| 5,882,844 A | 3/1999 | Tsuchiya et al. | 430/288.1 |
| 5,972,560 A | 10/1999 | Kaneko et al. | 430/270.1 |
| 6,087,064 A | 7/2000 | Lin et al. | 430/270.1 |
| 6,210,856 B1 | 4/2001 | Lin et al. | 430/270.1 |
| 6,258,506 B1 | 7/2001 | Harkness et al. | 430/198 |
| 6,309,796 B1 | 10/2001 | Nakashima et al. | 430/287.1 |
| 6,342,562 B1 | 1/2002 | Kozawa et al. | 524/588 |
| 6,406,828 B1 | 6/2002 | Szmanda et al. | 430/272.1 |
| 6,420,084 B1 | 7/2002 | Angelopoulos et al. | 430/270.1 |
| 6,420,088 B1 | 7/2002 | Angelopoulos et al. | 430/270.1 |
| 6,531,260 B2 * | 3/2003 | Iwasawa et al. | 430/270.1 |
| 6,653,048 B2 * | 11/2003 | Brock et al. | 430/270.1 |
| 6,790,587 B1 * | 9/2004 | Feiring et al. | 430/270.1 |
| 6,849,377 B2 * | 2/2005 | Feiring et al. | 430/270.1 |
| 2001/0006757 A1 * | 7/2001 | Fukino et al. | 430/270.1 |
| 2002/0090572 A1 | 7/2002 | Sooriyakumaran et al. | 430/271.1 |

FOREIGN PATENT DOCUMENTS

| | | |
|---|---|---|
| EP | 0 816 419 A | 1/1998 |
| JP | 2001-040092 A2 | 2/2001 |
| JP | 2001-040283 A2 | 2/2001 |
| JP | 2002-62654 * | 2/2002 |
| JP | 2002-82437 * | 3/2002 |
| WO | WO 02/091083 A1 | 11/2002 |

OTHER PUBLICATIONS

Machine-assisted English translation for JP2002-82437 (provided by JPO).*
Machine-assisted English translation of JP 2002-62654 (provided by JPO).*
Merhari et al., "Nanocomposite resist systems for next generation lithography", Microelectronic Engineering 1 (2002) 000-000.
Hu et al., "Nanocomposite resists for electron beam nanolithography", Microelectronic Engineering 56 (2001) 289-294.
Fedynyshyn et al., "Encapsulated Inorganic Resist Technology", Advances in Resist Technology and Processing XVII, (2000) pp. 627-637.
Watanabe et al., "Micropatterning of $SiO_2$ film using organosilicon nanocluster as a precursor", Thin Solid Films 354 (1999), pp. 13-18.
Ro et al., "Novel Processible Poly(methylsilsesquioxane) Copolymers for Low Dielectric Applications", 2002.
Shea et al., "Bridged Polysilsesquioxanes: Molecular Engineering of Hybrid Organic Inorganic Materials", MRS Bulletin (May 2001) pp. 368-376.

* cited by examiner

*Primary Examiner*—Sin Lee
(74) *Attorney, Agent, or Firm*—Peter F. Corless; Darryl P. Frickey; Edwards Angell Palmer & Dodge LLP (57) ABSTRACT

New polymers are provided that have non-carbon tetravalent species (Si, Ti, Ge, Zr, Sn) and photoimageable compositions that contain such polymers. Preferred polymers are organic, e.g. one or more polymer repeat units comprise carbon atom(s). Particularly preferred are polymers that comprise $SiO_2$ or $TiO_2$ repeat units and which can be highly useful as a resin component of resists imaged at short wavelengths such as sub-300 nm and sub-200 nm.

16 Claims, 2 Drawing Sheets

| Dose (mJ/cm²) | 80nm 1:1 | 70 nm 1:1 | 65 nm 1:1 | 60 nm 1:1 |
|---|---|---|---|---|
| 79.8 (Under exp.) |  |  |  |  |

POLYMERS AND PHOTORESISTS COMPRISING SAME

The present application claims the benefit of U.S. Provisional Application No. 60/451,580 filed Mar. 3, 2003, which is incorporated herein by reference.

BACKGROUND

1. Field of the Invention

The present invention relates to new polymers that have non-carbon tetravalent species (Si, Ti, Ge, Zr, Sn) and photoimageable compositions that contain such polymers. Preferred polymers are organic, e.g. one or more polymer repeat units comprise carbon atom(s). Particularly preferred are polymers that comprise $SiO_2$ or $TiO_2$ repeat units and which can be highly useful as a resin component of resists imaged at short wavelengths such as sub-300 nm and sub-200 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced chemical transformation of the photoresist coating to thereby transfer the pattern of the photomask to the photoresist-coated substrate. Following exposure, the photoresist is developed to provide a relief image that permits selective processing of a substrate.

Photoresists are of particular interest that can be photoimaged with short wavelength radiation, including exposure radiation of about 300 nm or less, or 200 nm or less, such as wavelengths of about 248 nm (provided by KrF laser), 193 nm (provided by an ArF exposure tool), or 157 nm (provided by a $F_2$ excimer tool). See European Published Application EP915382A2.

Use of such short exposure wavelengths can enable formation of smaller features. Accordingly, a photoresist that yields well-resolved images upon 248 nm, 193 nm or 157 nm exposure could enable formation of extremely small (e.g. sub-0.2 or 0.1 μm) features that respond to constant industry demands for smaller dimension circuit patterns, e.g. to provide greater circuit density and enhanced device performance.

In addition to using shorter wavelengths during exposure, it is also desirable to use a thinner layer of resist. However, the major drawback of using a thin layer of resist is that the variation of resist thickness over a diffusion step on a substrate and into an etched pattern increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To attempt to improve dimensional control, bilayer (or bilevel or multilevel) resist systems have been utilized. In a typical bilevel system, a bottom resist is first applied to a substrate to planarize wafer topography. The bottom resist is cured and a second thinner imaging top resist is then applied over the bottom resist. The top resist is then soft baked, and patterned (or imaged) using conventional resist exposure and development, followed by etch transfer of the top pattern through the bottom resist using the top resist pattern as an etch mask. See Sugiyama et al., *Positive Excimer Laser Resists Prepared with Aliphatic Diazoketones, Soc. Plastics Eng., Conference Proceedings,* pages 51-60 (November 1988); and U.S. Pat. Nos. 4,745,169; 5,338,818; 5,619,396; 5,731,126; 6,296,985; and 6,340,734. See also WO 02/091083; U.S. Pat. Publication 2002/0090572; and U.S. Pat. No. 5,378,585.

Certain inorganic Si compositions for imaging have been reported. See Fedynyshyn et al., Encapsulated Inorganic Resist Technology, *Proceedings of SPIE*, vol 3999, p. 627 (2000); Y. Hu et al., Nanocomposite resists for electron beam lithography, *Microelectronic Engineering* 56, 289 (2001); L. Merhai et al., Nanocomposite resists systems for next generation lithography, *Microelectronic Engineering* 1 (2002). These reported systems are currently not practical for high performance applications.

A problem associated with the thin-layer bi-layer resist systems is to provide acceptable transparency to exposure radiation as well as good resistance to plasma etchants. This is particularly an issue for bi-layer resists that are imaged at sub-200 nm wavelengths such as 193 nm and 157 nm. See US Published Application 2003/0207205 and U.S. Pat. No. 6,593,058, where efforts at increasing etch resistance of bi-layer resists are reported.

It would be desirable to have new photoresists that could provide small images of high resolution. It would be particularly desirable to have new photoresists that could be effectively imaged with short wavelength radiation, including sub-300 nm such as 248 nm and sub-200 nm radiation such as 193 nm and 157 nm. It would be further desirable to have such photoresists that exhibited plasma etch resistance and good transparency to short exposure wavelengths such as 193 nm and 157 nm.

SUMMARY OF THE INVENTION

We now provide new relates to polymers that have non-carbon tetravalent species (Si, Ti, Ge, Zr, Sn) and photoresists that comprise such polymers. Preferred polymers of the invention have organic content.

Preferred polymers of the invention have a high SiO and/or TiO content, particularly where the polymer comprises repeat units that in combination have an SiO formula of $SiO_{1.5<x<2}$ or a TiO formula of $TiO_{1.5<x<2}$.

We have found that polymers of the invention can exhibit exceptional performance properties that render them particularly suitable for use as a photoresist resin. Notably, preferred polymers of the invention can exhibit high glass transition temperatures (e.g. above about 150° C. or 160° C.); high Si or Ti content which can impart good resistance to plasma etchants; and excellent transparency to exposure radiation, including short wavelengths such as sub-200 nm e.g. 193 nm and 157 nm.

We have demonstrated that photoresists of the invention that contain such polymers can provide high resolved images at sub-200 nm and sub-170 nm exposure wavelengths, particularly 193 nm and 157 nm. See, for instance, the results of the Examples which follow.

Preferred polymers of the invention include functional groups that can enable photoimaging, e.g. a photoacid-labile groups such as photoacid-labile ester or acetal groups or other contrast-enhancing groups such as a fluorinated alcohol (to provide positive-tone resist relief images), or sites for crosslinking such as hydroxy (to provide a negative-tone resist relief image.

As discussed above, preferred polymers are organic and comprise one or more repeat units that comprise carbon-containing groups such as alkyl, carbon alicyclic, or carbocyclic aryl such as phenyl, naphthyl and the like. Preferably, the carbon-containing groups aere interspersed throughout a polymer (e.g. not just end groups) and may be pendant groups or comprise part of the polymer backbone. Suitably, at least 5 weight percent of a polymer is carbon, and preferably at least about 10, 20, 30 or 40 weight percent of a polymer is carbon.

Polymers particularly suitable for use in photoimageable compositions of the invention may be characterized in part by as copolymers that comprise the silicate formula $SiO_2$ or $TiO_2$ as one of the multiple, distinct copolymer repeat units. For such Si polymers, preferably the polymer will have an SiO formula of $SiO_{1.5<x<2}$ and contain photoacid-labile groups, e.g. photoacid-labile ester or acetal groups as a component of one or more repeat units, or other contrast-enhancing group such as a fluorinated alcohol as a component of one or more repeat units.

Preferred Si polymers of the invention may comprise repeat units of structures shown in the following Formula (I):

(1)

wherein R is hydrogen or preferably a non-hydrogen substituent e.g. an optionally substituted alkyl particularly $C_{1-20}$ alkyl; optionally substituted alicyclic particularly $C_{3-20}$ alicyclic such as norbornyl, adamantyl, cyclohexyl, isobornyl, fenchyl, and the like; optionally substituted aryl such as optionally substituted carbocyclic aryl such as optionally substituted phenyl, naphthyl, and the like, or optionally substituted heteroaryl; and m and n are each greater than zero. The R group also may include a group that promotes photo-imaging, e.g. a photoacid-labile group such as an ester or acetal or a contrasting-enhancing group such as a fluorinated alcohol. The value m is preferably 20 to 90 percent based on the total number of polymer units. Again, preferred are polymers that contain at least some repeat units with carbon content (to provide an organic polymer) such as optionally substituted alkyl, optionally substituted alicyclic, optionally substituted carbocyclic aryl and the like.

Particularly preferred polymers of the invention include polymers that have 2 or more distinct repeat units (e.g. terpolymers, tetrapolymers), which may include additional repeat units to provide for further modulation of photoresist properties. For instance, preferred polymers may comprise repeat units of structures shown in the following Formula (II):

(II)

wherein $R^1$ and $R^2$ are different and may be hydrogen or a non-hydrogen substituent, and preferably both of $R^1$ and $R^2$ are non-hydrogen substituents such as those discussed above R of Formula I; and x, y and z are each greater than zero. Preferably, at least one of R or $R^1$ includes a group that promotes photoimaging, e.g. a photoacid-labile group or a contrasting-enhancing group such as a fluorinated alcohol. Again, preferred are polymers that contain at least some repeat units with carbon content (to provide an organic polymer) such as optionally substituted alkyl, optionally substituted alicyclic, optionally substituted carbocyclic aryl and the like.

The invention also includes polymers related to those of the above Formulae I and II, but where the Si atom(s) are replaced by a non-carbon tetravalent species (atom), particularly Ti, Zr, Ge or Sn, more particularly Ti, Zr, or Sn, especially Ti. While the present disclosure often refers to polymers of the invention as having Si content, the invention includes such polymers having Ti, Zr, Ge or Sn, especially Ti substitution in place of Si, and references to Si polymers is equally applicable to such Ti, Zr, Ge and Sn polymers. The invention also includes compositions (e.g. resist compositions) that comprise blends of one or more of the present Si-polymers and such Ti, Zr, Ge and/or Sn polymers of the invention.

In another aspect, preferred polymers of the invention may be characterized as being obtainable by reaction of one or more compounds that comprise a non-carbon tetravalent species (atom) with at least two reactive groups (e.g. leaving groups) for a hydrolysis or condensation reaction, more preferably three or four such reactive groups. The preferred tetravalent species is Si, although other species also can be useful such as Ti, Zr, Ge, Sn and the like. Preferred reactive groups (e.g. leaving groups) include halogen (particularly Cl, Br and I), alkoxy, aryloxy, or a group such as hydroxy that can be modified to a suitable leaving group. Mixtures of reactive groups also are suitable. For example, a monomer containing both halogen and alkoxy groups may be advantageously used.

In such aspects of the invention, preferred polymers of the invention may be provided by reaction of one or more compounds of the following formula (III):

(III)

wherein each M is independently Si, Ti, Zr, Ge or Sn, and preferably is Si, Ti, Zr, or Sn, and more preferably M is Si or Ti;

each Y is the same or different and at least two Y groups are reactive groups (e.g. leaving groups) toward a hydrolysis or condensation reaction, preferably three or four Y groups are such reactive groups.

Polymers of the invention may comprise a mixture of distinct non-carbon tetravalent atoms Si, Ti, Zr, Ge and/or Sn, such as a polymer that comprises both Si and Ti atoms. However, for many applications, it may be preferably that a polymer contain only a single type of non-carbon tetravalent atoms of Si, Ti, Zr, Ge or Sn, i.e. from the group of Si, Ti, Zr, Ge or Sn, the polymer will only contain Si atoms, or the polymer will only contain Ti atoms.

Particularly preferred reactive compounds for synthesis of the present polymers correspond to the following formula (IV):

(IV)

wherein each Y is the same or different halogen, $C_{1-8}$alkoxy, hydroxy, halogen or linkage (chemical bond) to an Si atom, with at least at two Y groups being halogen or alkoxy, preferably $C_{1-4}$alkoxy or $C_{1-3}$alkoxy such as methoxy or ethoxy.

Preferred polymers of the invention will have a high Si content, e.g. at least about 10, 12, 15, 16, 17, 18, 19 or 20 atom weight percent of total polymer being Si. Preferred polymers of the invention also may have a relatively high portion of $SiO_2$ repeat units, e.g. where at least about 20 percent of total polymer units of the polymer are $SiO_2$, or where at least about 30, 40, 50, 60, 70, 80 or even 90 percent of total number of polymer units of the polymer are $SiO_2$.

Preferred polymers also may be fluorinated, e.g. comprise carbons having one or more fluorine atoms as part of the polymer pendant groups. For instance, preferred polymer substituents include —$CF_3$ and other $C_{1-20}$haloalkyl groups particularly $C_{1-20}$ fluoroalkyl groups such as —$CHF_2$, —$CH_2F$, —$CH_2CF_3$, —$CF_2CF_3$, and the like as well as haloalkoxy particularly fluoroalkoxy such as $C_{1-20}$ fluoroalkoxy, e.g. —$OCF_3$, —$OCH_2CF_3$, and the like. Such fluorine substituents may be directly linked to an Si atom of a polymer, or may a substituent of another polymer group such as an alicyclic unit. Also suitable is direct fluorine substitution of Si atoms, e.g. groups of the formula Si-F, Si-$F_2$, and the like.

Also preferred for many applications are polymers of the invention that comprise repeat units with alcohol moieties.

For short-wavelength imaging, particularly sub-nm 200 imaging, preferably the polymer has low aromatic content to provide enhanced transparency. For instance, preferred polymers for such short wavelength imaging will be substantially free of aromatic groups, e.g. less than about 5, 4, 3, 2, 1 or 0.5 mole percent aromatic groups based on total polymer units. Even more preferred will be polymers that are completely free of aromatic groups.

Preferred polymer pendant units for use in resists imaged at 193 nm include alicyclic groups that can modulate resistance to plasma etchants. Optionally substituted norbornyl, adamantyl, fencyl and isobornyl are preferred alicyclic groups, although other alicyclic moieties having 1 to 4 separate or fused alicyclic rings and from 5 to about 20 ring atoms also will be suitable. Preferably, such alicyclic groups will contain photoacid-labile or other contrast-enhancing moieties such as a photoacid-labile ester or acetal group or a fluorinated alcohol.

Polymers of the invention also suitably may contain phenolic or other aromatic groups, particularly where the polymer is used in a resist imaged at higher wavelengths, particularly wavelengths greater than 200 nm such as such as 248 nm. Polymers having phenolic or other aromatic substitution also may be useful in photoresists imaged with E-beam or EUV radiation sources. Such polymers that contain aromatic groups may be provided e.g. by polymerization of a phenyl group substituted with a trichlorosilyl group, trialkoxysilyl, and the like.

Polymers of the invention suitably may have a variety of molecular weight polydispersity values (i.e. Mw/Mn). For instance, suitable polymers include those that have an Mw/Mn of about 20 or less, more typically about 10 or less, or about 5 or 4 or less. For many applications, narrow molecular weight polydispersities may be preferred, such as an Mw/Mn of about 3 or 2 or less, or even lower such as about 1.7, 1.6, 1.5, 1.4, 1.3 or 1.2 or less.

In another aspect, the present polymers may be polymerized in the form discrete particles, i.e. as separate and distinct polymer particles. Such polymer particles typically have one or more different characteristics from linear or ladder silicon polymers. For example, such polymer particles typically have a defined size and a low molecular weight distribution.

More particularly, in a preferred aspect, a plurality of the polymer particles of the invention typically has a mean particle size of from about 5 to 3000 angstroms, more preferably from about 10 to 2000 angstroms, still more preferably from about 10 to about 1000 angstroms, yet more preferably from about 10 to about 500 angstroms, even more preferably from 10 to 50 or 100 angstroms.

Figure 2:
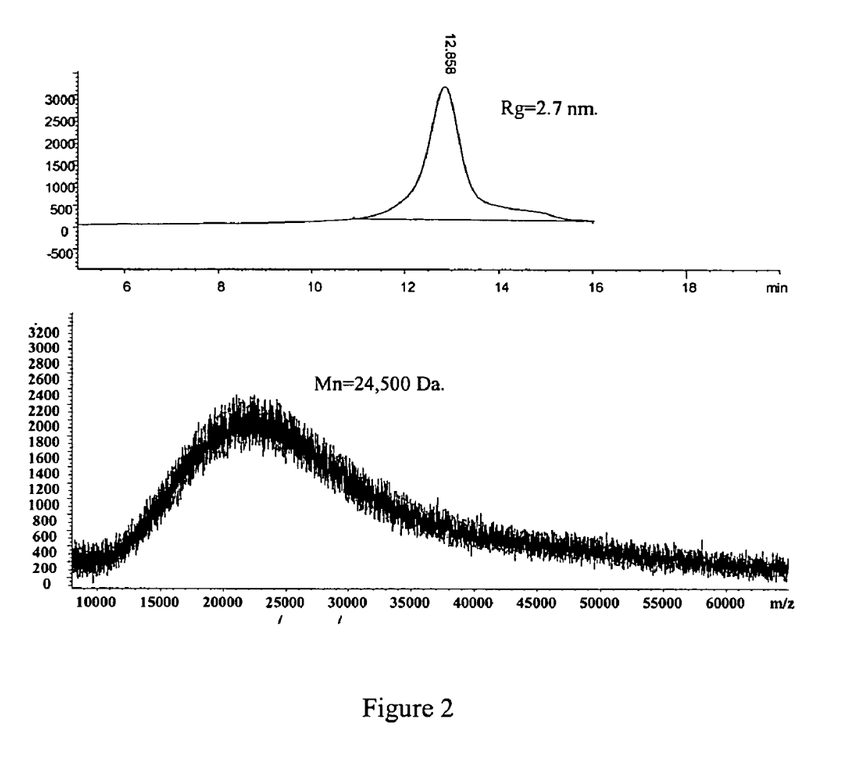
FIG. 2 shows the gel permeation chromatography (top panel) and mass spectra (bottom panel) of polymer particles as determined in Example 19 which follows.

A plurality of preferred polymer particles of the invention typically has a narrow molecular weight polydispersity (Mw/Mn), such as about 1.3, 1.2 or 1.1 or less and even approaching about 1 as may be determined by gel permeation chromatography and/or mass spectroscopy. See, for instance, the results set forth in FIG. 2.

As noted above, we also have found that polymers and photoresists of the invention can exhibit notable transparency to short wavelength radiation, particularly sub-200 nm radiation, especially 193 nm and 157 nm.

In a further aspect, photoresists and polymers are provided that are highly transparent to 157 nm radiation. In particular, the invention provides photoresists suitable for 157 nm imaging that comprise a photoactive component and a polymer component, where the resist composition has a low absorbance of 157 nm radiation such as an absorbance of 1.5 or less (i.e. $Abs_{157}/\mu m$ of 1.5 or less). Even lower absorbing photoresists are provided, including photoresists suitable for 157 nm imaging that comprise a photoactive component and a polymer component, where the photoresist composition has an $Abs_{157}/\mu m$ of 1.4, 1.3 or 1.2 or less, or an $Abs_{157}/\mu m$ of 1.1 or 1 or less, or even an $Abs_{157}/\mu m$ of 0.9, 0.8 or 0.7 or less or an $Abs_{157}/\mu m$ of 0.6 or 0.5 or less.

In such photoresists, the photoactive and polymer components may be a single integral material (e.g. a resin with covalently linked photoacid generators), but more typically those components will be distinct (not covalently linked) materials e.g. a resist that contains one or more photoacid generator compounds and one or more distinct polymers. The present polymers are preferred for use in the low absorbance photoresists of the invention, particularly the present Si polymers, particularly having an SiO formula of $SiO_{1.5<x<2}$. Even more preferably, such polymers are fluorinated.

In addition to such resists, photoimageable polymers are provided that exhibit low absorbance of 157 nm radiation. In this aspect, preferred photoimageable polymers will have an $Abs_{157}/\mu m$ of 1.2 or 1.1 or less, or an $Abs_{157}/\mu m$ of 1 or less, or even an $Abs_{157}/\mu m$ of 0.9, 0.8, 0.7, 0.6 or 0.5 or less. Preferred are the Si copolymers, particularly the present Si polymers that have an SiO formula of $SiO_{1.5<x<2}$. Fluorinated polymers are especially preferred.

Absorbance values (including $Abs_{157}/\mu m$ values) as referred to herein are determined by the following protocol. A photoresist or polymer film is spin coated on a silicon microelectronic wafer substrate and solvent is removed by a softbake (110° C. for 60 seconds) with a vacuum hotplate. The absorbance of the dried coating layer is measured at the specified radiation wavelength (e.g. 157 nm) using a VU-301 vacuum ultraviolet variable angle spectroscopic ellipsometer (VUV-VESA) instrument (suitably as commercially available from J. A. Woollam Co.). The measured absorbance is normalized to 1 µm photoresist or polymer film coating thickness.

In addition to a resin of the invention, typical photoresist compositions of the invention also will contain a photoactive component, e.g. one or more photoacid generator compounds. References herein to a polymer or a resin of the invention are inclusive of that polymer in particle form.

Photoresists also will include a mechanism to provide sufficient solubility differentials between exposed and unexposed regions of a coating layer of the resist to enable formation of a relief image upon development.

Chemically-amplified positive-acting photoresists suitably will contain a component that preferably has one or more photoacid-labile deblocking groups, i.e. groups that undergo reaction in the presence of photogenerated acid to provide a polar group such as carboxy, hydroxy and the like. Preferred photoacid-labile groups include photoacid-labile esters or acetal groups. Such photoacid-labile group(s) suitably will be substituents of the silicon-containing resin, but the resist also may contain a separate component such as a separate oligomer or polymer that contains such photoacid-labile group(s).

Positive photoresists imaged at short wavelengths also may suitably contain fluorinated alcohol groups, e.g. alcohols that have proximate (within one, two or three carbons from the hydroxy-substituted carbon) fluorine substitution.

Negative-acting resists of the invention typically will contain an agent for crosslinking of one or more of the components of the resist, typically a separate crosslinker component such as an amine-based reagent, e.g. a melamine or benzoguanamine resin. Resins used in negative-acting photoresists preferably contain primary or secondary alcohol moieties.

Photoresists of the invention are preferably employed in multilayer lithography systems. More particularly, preferred uses of resists of the invention include application of a first organic polymer coating on a substrate, e.g. a semiconductor microelectronic wafer, and applying thereover a photoresist of the invention. The organic bottom layer suitably may be non-photoimageable (e.g. not contain a photoacid generator compound) but is thermally crosslinked prior to application of the resist layer. The bottom layer may comprise a phenolic polymer such as a novolac admixed with a thermal acid generator compound and a crosslinker. Use of such a bottom layer can enable application of a very thin top resist layer.

The invention also provides methods for forming relief images, including methods for forming a highly resolved relief image such as a pattern of lines where each line has essentially vertical sidewalls and a line width of about 0.40 microns or less, and even a width of about 0.2, or 0.10 microns or less, such as lines having widths of 80 nm or less. The invention further provides articles of manufacture comprising substrates such as a microelectronic wafer substrate (e.g. a wafer having a diameter of less than 20 or 10 inches), optoelectronic device substrate, waveguide or liquid crystal display substrate or other flat panel display substrate having coated thereon a polymer, photoresist or resist relief image of the invention. The invention also includes methods to produce such articles of manufacture, which comprise use of a photoresist of the invention.

DETAILED DESCRIPTION OF THE INVENTION

As discussed above, we now provide silicon polymers that have a high SiO content.

In a particular aspect, photoimageable copolymers are provided that comprise repeat units of $SiO_2$ and/or $TiO_2$.

In another aspect, photoimageable copolymers are provided that comprise repeat units that in combination have an SiO formula of $SiO_{1.5<x<2}$ (e.g. at least a portion such as at least 10, 20, 30, 40, 50, 60, 70, 80 or 90 percent of total repeat units of the polymer has such a SiO formula) and/or where the entire photoimageable copolymer has an SiO formula of $SiO_{1.5<x<2}$.

References herein that a polymer (including copolymer) is photoimageable indicate that the polymer has one or more photoacid-labile moieties such as a photoacid-labile ester (e.g. t-butylester) or acetal group, or other contrast-enhancing group such as a fluorinated alcohol. In other words, for example, as a component of a photoresist composition, the photoimageable polymer can react (e.g. a cleavage reaction) or otherwise operate together with photogenerated acid (such as produced from a photoacid generator compound) to provide developer solubility differentials between exposed and unexposed regions of a coating layer of the photoresist.

Preferred polymers of the invention may comprise repeat units as shown in the following Formulae (I) and (II):

wherein in those formulae R, $R^1$ and $R^2$ are hydrogen or non-hydrogen substituents such as those discussed above, and m, n, x, y and z are each greater than zero. Suitably R, $R^1$ and $R^2$ are all other than hydrogen. Preferred R, $R^1$ and $R^2$ groups include the following structures:

wherein in those structures the open bond (—) at the left of the structure is a chemical bond to the polymer, R" is a chemical bond or a linker e.g. a hetero atom such as S or O or an optionally substituted alkylene such as $C_{1-8}$alkylene; BG is a blocking group such as a photoacid-labile group e.g. a ester (e.g. t-butylester) or an acetal group such as may be provided by reaction of a hydroxy group with an ethyl vinyl ether group, or BG may be a group generally inert to lithographic processing such as $C_{1-8}$alkyl, alkylsulfonate such as mesyl, and the like; X may be a hydrogen or a blocking group such as defined for BG immediately above; and $R^3$ is a group that provides a photoacid-labile moiety e.g. where $R^3$ provides a quaternary carbon bonded to the ester oxygen such as a t-butyl moiety.

In Formula I above, the values of m and n suitably may vary rather widely. For instance, suitably m (i.e. number percent of $[Si(R)O_{3/2}]$ repeat units in the polymer based on total polymer units) is from 2 to 90 or 95 percent, more typically from 5 to 30, 40, 50, 60, 70 or 80 percent of the total number of polymer repeat units, with the balance of polymer units being $SiO_2$ repeat units, or other units. Thus, in turn, in Formula I, suitably n (i.e. number percent of [$SiO_2$] repeat units in the polymer based on total polymer units) is from 2 to 90 or 95 percent, more typically from 10 to 15, 20 30, 40, 50, 60, 70, 80 or 85 percent based on the number of total polymer repeat units, with the balance of polymer units being $Si(R)O_{3/2}$ repeat units, or other units.

Similarly, in Formula II above, the values of x, y and z suitably may widely vary. For instance, suitably the sum of x and y (i.e. number percent of [$Si(R^1)O_{3/2}$] and [$Si(R^2)O_{3/2}$] repeat units in the polymer based on total polymer units) is the same as discussed for m immediately above, and values for z are suitably the same as discussed for n immediately above. The respective values of x and y can vary widely, e.g. x and y suitably may each be from 2 to 80 percent based on total polymer units, more typically x and y suitably may be 5 to 10, 15, 20, 30, 40, 50, 60 or 70 percent based on total polymer units.

Polymers of the invention can be readily synthesized. Preferred syntheses include a condensation or hydrolysis reaction under acidic or basic conditions. If any of the reactants are acid-sensitive, such as a photoacid-labile moiety, then preferably the polymerization reaction is conducted under basic conditions.

In general, one or more reactive Si reactants such as those of the above Formulae III or IV are reacted in the presence of base and water with one or more other reactants preferably in a suitable organic solvent for a time sufficient to form the desired polymer. The reaction can be run at elevated temperatures as needed to promote polymerization e.g. at 50° C., 70° C., 80° C. or 90° C. or higher. Preferably, one or more organic solvents are used, e.g. an ether, ketone or aromatic solvent such as acetone, propylene glycol methyl ether acetate, glyme, toluene, xylenes and the like. The amount of water is typically present in an amount of a molar equivalent or excess relative to the leaving group(s) on the Si reactant (e.g. a reactant of Formula III or IV above). The base may be an organic or inorganic reagent. Good results have been obtained with organic bases such as triethylamine, dicyclohexylamine and the like. The base is suitably present in a molar equivalent or excess relative to the Si reagent. See the Examples which follow for exemplary reaction conditions.

In general, a molar excess of water and base and elevated reaction temperatures can be employed to promote or enhance polymerization.

While use of base can be preferred where acid-sensitive groups (such as photoacid-labile moieties) are present, an alternative approach employs an acid-based condensation reaction to form the polymer and then functionalized the formed polymer with photoacid-labile groups, or other acid-sensitive groups as may be desired. See, for instance, the procedures of Examples 22 and 23, which follow.

As discussed above, a variety of other monomers or oligomers may be reactant with an Si reagent such as those of the above Formula III or IV. Preferred reactants will have a reactive Si group such any or a variety of hydrosilylated or halosilylated monomers. See, for instance, the reactants used in the Examples which follow.

Preferred polymers of the invention include those that are formed from polymerization of a silyl halide or silyl alkoxide, including trihalo and trialkoxy compounds such as those of the formula $R-Si(OC_{1-3}alkxoy)_3$ e.g. $R-Si(OCH_2CH_3)_3$ or $R-Si(halide)_3$ e.g. $R-Si(Cl)_3$, as well as mixed alkoxy-halosilanes such as $RSi(Cl)_2(OR)$ and $RSi(OR)_2Cl$. The R moiety on such compounds suitably may be aromatic (e.g. phenyl or naphthyl) or more preferably non-aromatic such as an optionally substituted alkyl or alicyclic groups such as norbornyl, adamantyl or the like. Such R groups may be substituted by a photoacid-labile group e.g. acid-labile ester such as t-butyl ester or acetal group, or an acetal group, or by aqueous base-solubilizing groups such as a fluorinated alcohol, sulfonamide, thiol, or the like. Such groups may be further substituted with electron-withdrawing groups such as fluorine, cyano, etc.

A preferred co-reactant with such trihalo or trialkoxy or mixed tri(halo/alkoxy) reactants is a tetrafunctional (4 leaving groups) reactant such as a tetraalkoxysilane that can react to provide $SiO_2$ units in the formed polymer, whereas the such trihalo or trialkoxy or mixed tri(halo/alkoxy) reactants provides $Si(R)O_{3/2}$ polymer units.

Specifically suitable Si reactants include tetraethoxysilane, tetrapropoxysilane, triethoxychlorosilane ($SiCl(Et)_3$), and hexachlorodislane; Sn reactants such as tetrapropoxytin; and related Ti and Zr reactants e.g. Ti (IV) chloride, Ti (IV) butoxide, Ti (IV) ethoxide, zirconium (IV) ethoxide, zirconium (IV) propoxide, and the like, can be readily prepared, or are commercially available from vendors such as Gelest (Tullytown, Pa.).

We also have found the hydrolysis and condensation reactions of tetrafunctional metallic organic reactants such as tetraalkoxysilanes proceed at rates significantly faster than those of large, steric hindered trialkoxy organic silanes such as hexafluoroisopropanolnorbonyl(HFIPNB)-triethoxysilane. Such reactivity differences can result in producing polymers with large molecular weight distributions containing multiple distinct molecular components. Gelation of the reaction mixture also can occur with reaction of large, steric hindered reactants such as large trialkoxy organic silanes.

We have further found that such wide molecular weight distribution and gelation can be avoided if the triethoxysilane co-reactant R group is a relatively small alkyl e.g. of 1 to 12 carbon atoms (with no branches on the α-carbon) and that do not sterically inhibit or slow down the hydrolysis or condensation reactions. Examples of such an R group include fluoroalcohols such as 1,1,1-trifluoro-2-trifluoromethyl-pent-4-en-2-ol (BTHB)-triethoxysilane, 1,1,1-trifluoro-2-trifluoromethyl-pent-4-en-2-ol-ethoxy methyl ether-triethoxysilane, (1,1-bis-trifluoromethyl-but-3-enyloxy)-acetic acid tert-butyl ester (BTHBTBAC)-triethoxysilane, triethoxysilane of 3-trifluoromethyl-3-hydroxy-1-propene, and non fluoroalcohols such 2,2,2-trifluoroethyl-triethoxysilane or triethoxysilane of 2,2,2-tri fluoro ethyl ethyl ether. Abbreviations for certain substituent groups are used herein, including the following: TFAMNBB designates 2-trifluormethyl-bicyclo[2.2.1]hept-5-ene-2-carboxylic acid tert-butyl ester; BTHB designates 1,1,1-trifluoro-2-trifluoromethyl-pent-4-en-2-ol; BTHBTBAC designates (1,1-bis-trifluoromethyl-but-3-enyloxy)-acetic acid tert-butyl ester; and EOM designates ethoxyl methyl ether.

We have further found that reactants with such small R groups are favored to produces the discrete polymer particles of the invention. That is, the small R group containing trialkoxysilanes can condense with a tetraalkoxysilane to form dense, highly cross-linked, soluble, film-forming polymer structures (particles) that with appropriate substituents (e.g. photoacid-labile ester or acetal groups) can be photo-imaged as a photoresist composition. The formation of these particles can be catalyzed either by acid or base, preferably under strong base catalysis at elevated temperatures. See Examples 18 and 20 below for exemplary syntheses of polymer particles of the invention, which also are photoimageable.

As generally referred to herein, a photoimageable polymer will contain one or more repeat units that comprise photoacid-labile groups, such as photoacid-labile ester or acetal groups, or other contrast-enhancing groups such as a fluorinated alcohol, or the polymer will have sites that can crosslink with a crosslinker component (e.g. an amine-based crosslinker such as a melamine).

In copolymers (which includes polymers with at least two distinct repeat units and higher order polymers such as terpolymers and tetrapolymers) of the invention, each distinct repeat unit may be suitably present in a variety of relative amounts. Preferred amounts of the high Si content units in a polymer have been discussed above. Repeat units that have photoacid-labile groups suitably may be present in a polymer from about 1, 2 or 3 to about 10, 15, 20, 30, 40, 50 or 60 or more percent, based on total repeat units of the polymer, more preferably about 5, 10 or 20 to about 30, 40 or 50 mole percent based on total units of the polymer. Repeat unit(s) that do not contain photoacid labile groups and are not high in Si content, e.g. units that contain an alicyclic or phenyl group to modulate etch resistance, suitably may be present in a polymer from about 1, 2 or 3 to about 50 or 60 mole percent, based on total repeat units of the polymer, more preferably about 5, 10 or 20 to about 30 or 40 or 50 mole percent based on total units of the polymer.

Preferred Si-polymers for use in a negative-acting resist composition will comprise suitably primary and secondary hydroxy moieties, suitably primary or second alcohol groups that may be present as hydroxy$C_{1-20}$alkyl groups. Such primary and secondary hydroxy can be effective sites or moieties for crosslinking.

With reference to Formula I and II above, and other polymers groups discussed herein, the term "aryl" without further limitation includes both carbocyclic aryl and heteroaryl groups.

The term "carbocyclic aryl" includes groups that contain 1 to 3 separate or fused rings and from 6 to about 18 ring atoms, without hetero atoms as ring members. Specifically preferred carbocyclic aryl groups include phenyl, and naphthyl including 1-napthyl and 2-naphthyl and acenaphthyl, phenanthrencyl, and the like.

The term "heteroaryl refers to herein heteroaromatic groups that typically contain 1 to 3 seprate or fused ring with 1 or more, typically 1 to 3 N, O or S ring atoms and from 5 to 20 total ring atoms. Exemplary heteroaryl groups include, e.g., quinolinyl, pyridyl, pyrazinyl, indolyl, carbazoyl, furyl, pyrrolyl, thienyl, thiazolyl, pyrazolyl, oxazolyl, imidazolyl, indolyl, benzofuranyl, benzothiazolyl, pyridonal, and the like.

The term "alkyl" is intended to include both branched and straight-chain saturated aliphatic hydrocarbon groups, having the specified number of carbon atoms. Examples of alkyl include methyl, ethyl, n-propyl, i-propyl, n-butyl, s-butyl, t-butyl, n-pentyl, and s-pentyl. Preferred alkyl groups are $C_1$-$C_{12}$ alkyl groups. An alkyl group includes cyclic structures and may contain a multiple carbon-carbon bond provide the group is not aromatic (i.e. the term alkyl includes alicyclic, alkenyl and alkynyl).

As referred to herein, the term "carbon alicyclic" means each ring member of the non-aromatic group is carbon. The carbon alicyclic group can have one or more endocyclic carbon-carbon double bonds, provided the ring is not aromatic. Exemplary carbon alicyclic groups include cyclohexyl, norbornyl, adamantly, fenchyl, and the like. Typically carbon alicyclic groups may have from 3 to 18 or more ring atoms and 1 to 3 or 4 fused or otherwise linked rings.

"Haloalkyl" is intended to include both branched and straight-chain alkyl (as specified above), substituted with 1 or more halogen atoms. Preferred examples of haloalkyl include, but are not limited to, mono-, di-, or tri-fluoromethyl, mono-, di-, or tri-chloromethyl, mono-, di-, tri-, tetra-, or penta-fluoroethyl, and mono-, di-, tri-, tetra-, or penta-chloroethyl. Typical haloalkyl groups will have 1 to about 12 carbon atoms, more typically 1 to about 6 carbon atoms.

"Alkoxy" represents an alkyl group as defined above inclusive of an oxygen bridge. Examples of alkoxy include, but are not limited to, methoxy, ethoxy, n-propoxy, i-propoxy, n-butoxy, 2-butoxy, t-butoxy, n-pentoxy, 2-pentoxy, 3-pentoxy, isopentoxy, neopentoxy, n-hexoxy, 2-hexoxy, 3-hexoxy, and 3-methylpentoxy. Alkoxy groups typically have 1 to about 12 carbon atoms, more typically 1 to about 6 carbon atoms.

"Haloalkoxy" includes a haloalkyl group as defined above with a further oxygen bridge. Preferred examples of haloalkoxy groups include trifluoromethoxy, 2-fluoroethoxy, and difluoromethoxy.

The term "aryloxy" refers to an aryl that is an alkoxy group that has an aryl substituent, or an aryl group that has oxygen ring substitution and that oxygen is linked to a further group, for instance phenoxy is a preferred aryloxy group. Carbocyclic aryloxy groups are preferred for certain applications.

As used herein, the terms "alkylsulfonyl" or "alkylsulfonate" includes those groups having one or more sulfonyl ($SO_2$) or sulfonate ($SO_3$) respectively and typically from 1 to about 12 carbon atoms, more typically 1 to about 6 carbon atoms.

As discussed, various polymer moieties may be optionally substituted, including groups of Formulae I and II. A "substituted" substituent may be substituted at one or more available positions, typically 1, 2, or 3 positions by one or more suitable groups such as e.g. halogen (particularly F, Cl or Br); cyano; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; alkanoyl such as a $C_{1-6}$ alkanoyl e.g. acyl and the like; etc. For polymers used in resists imaged at 157 nm, substitution by fluorine and other electronegative groups will be preferred, while substitution by carbonyl groups will be less desirable due to excessive absorbance of 157 nm radiation by that functionality.

As discussed above, photoimageable copolymers are provided that comprise repeat units of $SiO_2$. These polymers may have an SiO formula of $SiO_{1.5<x<2}$. Additionally, as copolymers, these polymers have two or more distinct repeat units, with one of the repeat units being $SiO_2$. Typically a photoacid-labile group or other contrast-enhancing group is present on one or more of the non-$SiO_2$ repeat units.

These preferred photoimageable polymers of the invention are distinct from silicate ($SiO_2$) polymers, including $SiO_2$ homopolymers and surface-treated $SiO_2$ polymers.

For instance, preferred photoimageable $SiO_2$ copolymers of the invention do not require surface treatment to provide a non-$SiO_2$ component or a photoimageable functionality (such as a photoacid-cleavable ester or acetal group or a fluorinated alcohol). Additionally, preferred $SiO_2$ copolymers of the invention do not contain extended polymer regions that consist only of $SiO_2$ repeat units, e.g. preferred copolymers of the invention would not typically contain a region that had 200, 150, 100, 80, 50, 40 or even 20 $SiO_2$ units in uninterrupted sequence. Rather, in a preferred polymer of the invention, $SiO_2$ units would be dispersed in the polymer with other polymer units, such as repeat units of the formula $RSiO_{3/2}$ with that R group being as defined above in Formula I, including where R is a carbon-containing group such as alkyl, carbon alicyclic or carbocyclic aryl.

As discussed above, references herein that a polymer (including copolymer) is photoimageabole indicates that the polymer has one or more photoacid-labile moieties such as a photoacid-labile ester (e.g. t-butylester) or acetal group, or other contrast-enhancing group such as a fluorinated alcohol (e.g. 2-hexafluoropropanol).

As discussed, photoimageable compositions of the invention are preferably used in multiple-layer systems, i.e. where the photoimageable composition is disposed over a further organic (polymer composition) layer that itself is disposed over a substrate surface such as a microelectronic wafer or device substrate or an optical waveguide substrate.

Suitable underlayer compositions include those that comprise a phenolic polymer such as a novolak and/or poly(vinylphenol). Also preferred is where the underlying polymer composition is a crosslinking composition, e.g. contain an acid or acid generator compound such as a thermal acid generator compound and preferably a separate crosslinker component such as an amine-based material, e.g. a melamine or benzoguanamine resin. For such crosslinking composition, the applied underlayer may be crosslinked prior to application of the overcoated photoimageable composition, e.g. by suitable thermal treatment such as heating at 140° C., 150° C., 160° C., 180° C., 200° C. or 230° C. for a time sufficient for crosslinking such as 0.5, 1 or 2 minutes. In many aspects, the underlying polymer composition is suitably non-photoimageable. Preferably, the anti-reflective characteristics (absorbance) of the underlayer is matched to the top resist layer so that radiation reflected from the substrate can pass back to the resist layer in an amount sufficient to enhance the lithographic process.

Suitably, more than one silicon-containing polymer may be used in the present photoimageable compositions. Thus, the present photoimageable compositions may include one, two or more silicon-containing polymers. When two or more silicon-containing polymers are used, at least one is a silicon-containing polymer of the present invention. The remaining silicon-containing polymers may be conventional silicon-containing polymers or polymers of the present invention. In this way, blends of polymers may be advantageously used in the present photoimageable compositions. Such blends include blends of the present silicon-containing polymers with non-silicon-containing polymers. In these blends, a wide range of ratios of the blended polymers may be suitable. The specific ratio will depend upon the particular polymers combined and the characteristics (dissolution rate, etch resistance, photospeed, etc.) desired.

A wide variety of photoactive components may be used in the present invention, including, but not limited to, photoacid generators and photobase generators. Photoacid generators are preferred. It will be appreciated by those skilled in that art that more than one photoactive component may be used advantageously in the photoimageable compositions of the present invention.

The photoacid generators useful in the present invention are any compounds which liberate acid upon exposure to activating radiation, e.g. sub-300 nm radiation such as 248 nm, or sub-200 nm radiation such as 193 nm or 157 nm. Suitable photoacid generators include e.g. imidosulfonaytes, onium salts, halogenated triazines, sulfonated esters and halogenated sulfonyloxy dicarboximides.

Preferred PAGs for imaging at 157 nm, 193 nm and 248 nm imaging include imidosulfonates such as compounds of the following formula:

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctane-sulfonyl)oxy]-5-norbornene-2,3-dicarboximide.

Sulfonium and iodonium salts also suitable PAGs, particularly sulfonate salts. Two suitable agents for 193 nm and 248 nm imaging are the following PAGS 1 and 2:

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphor-sulfonate groups. In particular, preferred anions include those of the formula $RSO_3$- where R is adamantane, alkyl (e.g. $C_{1-12}$ alkyl) and perfluoroalkyl such as perfluoro ($C_{1-12}$alkyl), particularly perfluorooctanesulfonate, perfluorobutane-sulfonate and the like.

For imaging at 157 nm, a triphenyl sulfonium PAG is particularly preferred, complexed with anions such as the sulfonate anions mentioned above, particularly a perfluoro-alkane sulfonate such as perfluorobutane sulfonate.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, 2-(1-(2,3-benzodioxolyl))-4,6-bis(tribromomethyl)-1,3,5-triazine, and 2-(2-furylethylidene)-4,6-bis(trichloromethyl)-1,3,5-triazine. Other triazine type photoacid generators useful in the present invention are disclosed in U.S. Pat. No. 5,366,846, herein incorporated by reference.

Halogenated sulfonyloxy dicarboximides also will be useful as photoacid generators such as: 1-(((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3(2H)-dione; 2-(((trifluoromethyl)sulfonyl)oxy)-1H-benz(f)isoindole-1,3 (2H)-dione; 3,4-dimethyl-1-(((trifluoromethyl)sulfonyl) oxy)-1H-pyrrole-2,5-dione; 2-(((trifluoromethyl)sulfonyl) oxy)-1H-isoindole-1,3(2H)-dione; and 2-(((trifluoromethyl) sulfonyl)oxy)-1H-benz(de)isoquinoline-1,3(2H)-dione.

In positive-acting systems of the present invention, the photoactive components are typically added to photoimageable compositions in an amount sufficient to generate a latent image in a coating layer of resist material upon exposure to activating radiation. When the photoactive component is a photoacid generator, the amount is typically in the range of 0.1 to 15 percent by weight, based on the weight of the resin, and preferably 1 to 8 percent by weight.

In negative-acting systems of the present invention, the amount of photoactive component useful is any amount sufficient to catalyze cross-linking of the silicon-containing polymer or oligomer. The photoactive components are typically used in the range of 0.1 to 25% by weight, based on the total weight of the composition dry components (i.e. all components except solvent carrier). It is preferred that the photoactive component is present in an amount in the range of 0.1 to 15% by weight, more preferably in the range of 0.1 to 12% by weight, and still more preferably less than or equal to 5% by weight. A particularly suitable range is from 0.1 to 5% by weight based on total weight of the composition dry components.

Negative-acting resists preferably include one or more cross-linking agents in addition to the Si resin. Any aromatic or aliphatic cross-linking agent that reacts with the silicon-containing polymer or oligomer is suitable for use in the present invention. Such organic cross-linking agents will cure to form a polymerized network with the silicon-containing polymer or oligomer, and reduce solubility in selected solvents. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to: amine containing compounds, epoxy containing materials, compounds containing at least two vinyl ether groups, allyl substituted aromatic compounds, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Particularly suitable amine-based cross-linking agents include those of the following formula:

wherein $R^{11}$ and $R^{12}$ are independently selected from H, $(C_1-C_6)$alkyl and phenyl. Preferred alkyl groups for $R^{11}$ and $R^{12}$ are methyl and propyl.

Epoxy containing materials also may be useful as crosslinkers for negative resists of the invention may be suitably any organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule. Additionally useful epoxy containing materials for use as crosslinkers include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxides, such as bisphenol A ethoxylated diepoxide. Further examples of epoxides of this type are described in U.S. Pat. No. 3,018,262.

The photoimageable compositions of the invention may optionally further include one or more additional components, including, but not limited to, solvents, anti-striation agents, plasticizers, surfactants, base additives, speed enhancers, fillers, dyes and the like. In positive-acting systems, a base additive is typically used to adjust the photospeed of the composition. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

The photoimageable compositions of the present invention may be readily prepared by those skilled in the art. For example, a photoresist composition of the invention can be prepared by dissolving the components of the photoresist, i.e. polymer binder and photoactive component, in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof. 2-heptanone is often preferred for resists containing a fluorinated polymer.

Typically, the solids content of the photoresist composition varies from about 5 to about 35 percent by weight, based on the total weight of the composition. The resin binder and photoactive components should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

As discussed above, the present photoimageable compositions are particularly suitable for use as a top layer in a bilayer photoresist system. As also discussed above, in such a system, a bottom layer of a conventional photoresist, such as novolac polymer based resist, inert polyarylether-sulfone copolymer based resist or a novolac or polyhydroxystyrene-based thermally cross-linkable system. Such bottom layer is typically applied to or coated on a substrate using any of the above described procedures. The bottom layer is then hard baked such as at 230° C. for 2 minutes, after which the present photoimageable compositions are coated on the cured bottom layer. The bottom layers preferably contain an amount of a UV absorbing component, such as an anthracene dye, sufficient for optical density and etch performance. The bottom layers typically have a thickness of from 0.4 to 1 μm. The top layer of the present photoimageable compositions is typically from 0.05 to 1 μm thick, preferably from 0.05 to 0.5 μm, and more preferably from 0.05 to 0.3 μm.

After being coated on the bottom layer, the present photoimageable composition top layer is dried by heating (baked) to remove any solvent. It is preferably dried until the coating is tack free. Thereafter, it is imaged through a mask in a conventional manner. The exposure is sufficient to effectively activate the photoactive component of the photoresist to produce a patterned image in the resist coating layer, and more specifically, the exposure energy typically ranges from about 1 to 100 mJ/cm$^2$, dependent upon the exposure tool and the components of the photoresist composition.

The photoimageable compositions of the present invention may be activated by a variety of exposure wavelengths, such as 248, 193, 157 nm and 11-15 nm. However, the photoimageable compositions of the present invention may be used with other radiation sources, such as, but not limited to, visible, e-beam, EUV, ion-beam and x-ray.

Following exposure, the film top layer of the composition is preferably baked at temperatures ranging from about 70° C. to 160° C. Thereafter, the top layer film is developed to form an etch pattern. The exposed resist film is rendered positive working by employing a polar developer, preferably an aqueous based developer, such as quaternary ammonium hydroxide solutions, such as tetra-alkyl ammonium hydroxide, preferably a 0.15 to 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

The pattern is next transferred to the underlayer or bottom layer by etching, such as with an oxygen reactive ion etch process. After such processing, the resists, both top and bottom layers, may be removed from the processed substrate using any stripping procedures known in the art.

The present photoimageable compositions are useful in all applications where photoresists are typically used. For example, the compositions may be applied over silicon wafers or silicon wafers coated with silicon dioxide for the production of microprocessors and other integrated circuit components. As discussed, for many applications, the resist would be used as a bilayer system and disposed over an organic underlayer composition. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compositions of the invention. Other chemical vapor deposited layers, such as cap layers, etch stops and the like, may also be used as substrates.

The present compositions may also be used in optoelectronics applications, such as in the manufacture of optical waveguides, optical interconnects and the like. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art. Use of resists of the invention for waveguide applications and manufacture is suitably by procedures disclosed in WO 02/091083 to Gronbeck et al.

In one embodiment, for manufacture of an integrated circuit, a layer of the present compositions is disposed on a wafer substrate (e.g. having a diameter of less than 20 or 10 inches) by spin coating or other application.

The coated substrate is typically then cured, such as by baking, to remove any solvent. Such curing may be a variety of temperatures, depending upon the particular solvent chosen. Suitable temperatures are any that are sufficient to substantially remove any solvent present. Typically, the curing may be at any temperature from room temperature (i.e., 25° C.) to 170° C. Such curing typically occurs over a period of from 5 seconds to 30 minutes. Such curing may be affected by heating the substrate in an oven or on a hot plate.

After curing, the layer of the present composition disposed on the substrate is then imaged by exposure to actinic radiation through appropriate artwork or a mask. Following exposure, the composition is then cured at a temperature of from 40° to 160° C. Curing time may vary but is generally from about 30 seconds to about 1 hour. In a positive-acting resist, the exposed areas are rendered more soluble than the unexposed areas. Thus, the exposed areas may be removed, such as by contact with a suitable solvent, aqueous developer or solvent-water mixture, leaving only the exposed areas remaining on the substrate. Suitable aqueous developers include alkali metal hydroxides such as sodium hydroxide and potassium hydroxide in water as well as tetraalkylammonium hydroxide in wafer. Such developers are typically used in concentrations from 0.1 to 0.3 N, such as 0.15 to 0.26 N tetramethylammonium hydroxide in water. The choice of developer is well within the ability of those skilled in the art. Such development may be at a variety of temperatures such as from room temperature to about 100° C. The time of such development depends upon the material to be removed and the temperature used, but is generally from about 10 seconds to about 1 hour.

All documents mentioned herein are incorporated herein by reference. The following non-limiting examples are illustrative of the invention.

EXAMPLES 1-5

Syntheses of Monomers Useful for Preparation of Polymers of the Invention

Example 1

Synthesis of 1,1,1-trifluoro-2-trifluromethyl-pent-4-en-2-ol (BTHB)-triethoxysilane Part 1. To 10 g of 1,1,1-trifluoro-2-trifluoromethyl-pent-4-en-2-ol (48 mmol) dissolved in 30 ml of anhydrous toluene were added 7.2 g of trichlorosilane (53 mmol) and 5 drops of Karstedt's catalyst solution. The reaction mixture was heated to reflux and while stirred with a magnetic stirring bar was kept at reflux overnight. After this period of reaction the solvent and the other volatiles components present in the product mixture were remover under reduced pressure. $^1$H NMR spectroscopy of the residue showed that the formation of the trichlorosilane intermediate had proceeded to completion. The product was then used to form polymers of the invention or the triethoxysilane monomer without further purification.

Part 2. 16 g of 1,1,1-trifluoro-2-trifluromethyl-pent-4-en-2-ol (BTHB)-trichlorosilane (46 mmol) prepared according to the above procedure was added to a 100 ml flask equipped with a magnetic stirrer bar. While the liquid was under a nitrogen atmosphere at ambient temperature and vigorously stirred, 9.6 g of anhydrous ethanol (0.21 mol) was added drop wise to the reaction flask over the course of one hour. After an overnight hold the reaction mixture was stripped of the volatile components under reduced pressure. $^1$H NMR spectrum indicated that the reaction had proceeded to completion. The product was then purified by vacuum distillation (70-72° C./6 mmHg).

Example 2

Synthesis of Hexafluoroisopropylnorbornyl (HFIPNB)-triethoxysilane

The syntheses of HFIPNB-trichlorosilane and HFIPNB-triethoxysilane are the same as those of BTHB-trichlorosilane and of BTHB-triethoxysilane as set forth in Example 1 above. The tricholorosilane intermediate was used to form polymers of the invention or converted as shown in the equation to the triethoxysilane monomer. The final triethoxysilane monomer was collected at 150° C./6 mmHg.

Example 3

Alternative Synthesis of HFIPNB-triethoxysilane

The HFIPNB-triethoxysilane monomer was also synthesized directly by the hydrosilation reaction of HFIPNB with triethoxysilane.

In a 500 mL 3-neck flask were added 70.00 g (255.40 mmol) of HFIPNB, 220 mL of anhydrous toluene, 46.10 g (280.94 mmol) of triethoxysilane, and a catalytic amount of hydrogen hexachloroplatinate(IV) hydrate ($H_2PtCl_6 \cdot xH_2O$). The reaction mixture was refluxed for 3 days at 125° C. Excess solvent and residual volatile starting materials were removed by a preliminary distillation, and the hydrosilated product was isolated by a vacuum distillation at 128~143° C. (0.8~2.0 mmHg). A colorless viscous liquid was obtained whose purity was determined by proton NMR and gas chromatography (GC).

Example 4

Synthesis of BTHB-EOM-triethoxysilane

Part 1: Synthesis of 1,1,1-trifluoro-2-trifluromethyl-pent-4-en-2-ol (BTHB)-ethoxy methyl ether (EOM)

In a 500 mL 3-neck flask equipped with a condenser and a dropping funnel were added 9.69 g (403.79 mmol) of sodium hydride, that is 60% dispersion in mineral oil and washed with anhydrous hexane, and 150 mL of dry THF. Mixture of 70.00 g (336.49 mmol) of BTHB and 50 mL of dry THF was slowly added to the reaction vessel through a dropping funnel. The whole solution was then refluxed for 16 h at 80° C. Added to the reaction mixture were 38.17 g (493.79 mmol) of chloromethyl ethyl ether and 20 mL of THF, and the reaction was stirred overnight under reflux. Reaction was cooled down to room temperature and 200 mL of potassium hydroxide aq. solution was added to dissolve the salt. The aq. phase was extracted with two portions of 200 mL of dichloromethane, and combined organic bottom layer was then dried over magnesium sulfate. The excess solvent and residual starting materials were removed by the use of a rotary evaporator. 67.80 g of a colorless liquid was isolated by a simple distillation at 138~143° C. (78% yield, purity 99.24% by GC)

Part 2: Synthesis of BTHB-EOM-triethoxysilane

In a 500 mL 3-neck flask were added 60.00 g (225.50 mmol) of BTHB-ethoxy methyl ether, 220 mL of anhydrous toluene, 40.70 g (248.06 mmol) of triethoxysilane, and a catalytic amount of hydrogen hexachloroplatinate(IV) hydrate ($H_2PtCl_6 \cdot xH_2O$). The reaction mixture was refluxed for 3 days at 125° C. Excess solvent and residual volatile starting materials were removed by a preliminary distillation, and the hydrosilated product was isolated by a vacuum distillation at 88~99° C. (0.4~1.3 mmHg). A colorless viscous liquid was obtained and characterized by NMR and GC.

Example 5

Synthesis of 2-trifluormethyl-bicyclo[2.2.1]hept-5-ene-2-carboxylic Acid Tert-butyl Ester (TFAM-NBB)-triethoxysilane

The synthetic procedure is the same as BTHB-EOM-triethoxysilane as set above. A prolonged reaction time is needed to complete the hydrosilation reaction (3-5 days). The product was collected by vacuum distillation at 155-162° C./9 mmHg.

EXAMPLES 6-12

Syntheses of Polymers of the Invention

Example 6

Synthesis of Polymer Comprising 30 Parts of Monomer of Example 1, 20 Parts of Monomer of Example 5 and 50 Parts of Tetraethoxysilane(TEOS)

To a 100 mL three-neck flask equipped with a water cooled condenser and a magnetic stirrer bar were added 2 g (5.4 mmol) of BTHB-triethoxysilane, 1.534 g (3.6 mmol) of TFAMNBB-triethoxysilane, and 1,872 g (9 mmol) of TEOS, and 10.44 g (180 mmol) of acetone. To the solution were then added 1.8 g (18 mmol) $Et_3N$ and 1.62 g (90 mmol) of water. The reaction mixture was heated using a 80° C. oil bath and kept at reflux with stirring for 2 days. The reaction generally is complete after 2 days at reflux. The volatile components present in the product mixture were moved by the use of a rotary evaporator. About 3.5 g of white powder was obtained having a weight average molecular weight (Mw) of 5,513 Daltons (relative to polystyrene standards) and a number average molecular weight (Mn) of 4,050 Daltons as determined by gel permeation chromatography (GPC) using a Waters 244 chromatograph equipped with 4 ultrastyrogel columns at 25° C. with tetrahydrofuran solvent. The optical spectra of the polymer film after spin coated on a silicon wafer substrate was measured using a VU-301 vacuum ultraviolet variable angle spectroscopic ellipsometer (VUV-VESA) instrument manufactured by J. A. Woollam Co. After normalized to 1 μm the polymer absorbance ($A_{193}$) at 193 nm 0.017/μm and at 157 nm was 1.49/μm.

Example 7

By the procedure of Example 6 and using an appropriate alternate reactants mix, the following polymer was prepared having a lower 157 nm absorbance.

The polymer showed a weight average molecular weight of 5,386, a number average molecular weight of 4,338 and an absorbance at 157 nm of 1.29/μm and at 193 nm of 0.19/μm.

Example 8

Polymer Comprising Monomers of Example 3, Example 4 and TEOS

To a 100 mL flask were added 4.00 g (9.30 mmol) of BTHB-EOM triethoxy silane, 4.07 g (9.30 mmol) of HFIPNB-triethoxy silane, 3.87 g (18.60 mmol) of tetraethoxysilane (TEOS), 3.76 g (37.20 mmol) of triethylamine, 21.60 g of acetone and 3.35 g of water. The reaction mixture was heated with an 80° C. oil bath for 3 days. After cooling to room temperature, the solvent and other volatile substances were removed under vacuum for 3 hours at 120° C. Alternatively, the reaction mixture can be precipitated into hexanes to remove the low molecular weight impurities followed by drying. The solid product was then dissolved in ethyl acetate and treated with IRN-150 ion exchange resin to remove residual triethylamine. Ethyl acetate was evaporated and the product collected as a white solid (about 71% overall yield) having a Mw of about 3,600 Daltons and a 157 nm absorbance of about 1.23/μm. Differential scanning calorimetric (DSC) measurement of the polymer showed a glass transition of about 188° C. The elemental analysis conducted by Galbraith Laboratories, Inc. reported the polymer to contain about 14.6% silicon, 29.8% fluorine and 31.3% carbon.

Example 9

By the procedure of Example 8 and using an appropriate alternate reactants mixture, the following polymer was prepared:

The polymer showed a weight average molecular weight of 3,649 Daltons and an absorbance at 157 nm of 1.12/μm demonstrating that a polymer composition comprising a greater amount of the $SiO_2$ component is beneficial to reduce the 157 mn absorbance. Furthermore as the amount of the $SiO_2$ component is increased in the polymer composition the glass transition temperature of the polymer can no longer be measured because no discreet inflections in the thermograph are observed. The elemental analysis reported 16.9% silicon, 27.6% fluorine and 29.5% carbon.

Example 10

By the general procedure of Examples 8 without the use of the ion exchange step one part of monomer of Example 1 and one part of monomer of Example 2 were condensed to produce a resin having a Mw of 3,152 Daltons. The resin was then thermally treated for 5 hours at 160° C. without significantly changing the molecular weight (Mw=3098; Mn=2816). The characteristics of this material were: $A_{157}$ nm was 1.19/μm, Tg about 20° C., dissolution rate of greater than 1500Å/sec.in an aqueous 0.26N tetramethylammonium hydroxide developer and a silicon content of about 9.5 percent.

Example 11

By the general procedure of Example 10, without using the product thermal treatment step, one part of monomer of Example 3 and one part of monomer of Example 4 and one part of TEOS were condensed to form a polymer with a Mw of about 6,435, Mn of 5.044 and a $A_{157}$ of 1.23/μm. The dissolution rate in the 0.26N developer was about 1070Å/sec and a measured silicon content of about 12 percent.

Example 12

Synthesis of a Polymer Suitable for 193nm Photoresist

To a 100 mL three neck round bottom flask equipped with a top-opened coiled reflux condenser were added 3.31 g (9.21 mmol) of TBENB-triethoxysilane, 6.00 g (16.12 mmol) of BTHB-triethoxysilane, 4.31 g (20.73 mmol) of tetraethoxysilane, 27.09 g (260.68 mmol) of acetone. A mixture of 4.66 g (46.07 mmol) of triethylamine and 4.15 g (230.34 mmol) of water was then slowly added to the reaction mixture at room temperature with stirring. The reaction was heated with an oil bath set at about 110° C. and stirred at this temperature for 45 h. After cooling to room temperature, 10 mL of acetone was added and the polymer precipitated into about 800 mL of hexane. The precipitate was collected by filtration and dried under vacuum for 16 h at 50° C. About 6.02 g of white powder was obtained in 77.8% yield. The calculated elemental F content is 23.7 wt. %, the Si content is 16.7 wt. % and the F/Si ratio is 1.42. Gel permeation chromatography of the polymer showed a $M_w$ of about 8670, $M_n$ of about 6240, and a Mw/Mn ratio of 1.39. Differential scanning calorimetric showed two transitions, one at 185° C., and one at 270° C. Thermal gravimetric analysis showed a major weight loss centered at 381° C. The absorbance at 157 nm was about 2.15/μm, at 193 nm was about 0.0086/μm with a dissolution rate of 0.4 Å/sec in the MF-CD26 developer, while in the MF-312 developer the dissolution rate was greater than 543 Å/sec.

Example 13

Synthesis of Ti Polymer 1.687 gms, (5.1 mmoles) of TBuNBSiCl3, 1.83 gms (5.1 mmoles) of BTHB-trisethoxysilane and 2.33 gms (10.2 mmoles) of Ti(OEt)4 were diluted with 15 gms of acetone and stirred at room temperature. To that mixture, over 10 minutes was added a mixture of 2.58 gms of triethylamine and 2.5 gms of water. The mixture was stirred at room temperature for 2 hours. The pH was adjusted from 7.85 to 9.0 with the addition of 1.7 gms of triethylamine and the system was brought to reflux (57C) and held at reflux for 44 hours. The mixture was then cooled to room temperature and quenched in 200 ml of deionized water. The solids were than isolated by filtration and washed with 2×25 ml deionized, followed by 2×25 ml heptanes. The solids were than vacuum dried at 50C to yield 3.2 gms of product. Mw 11933, Mn 2488, PD 4.8.

EXAMPLES 14-17

Photoresist Preparation and Lithographic Processing

Examples 14-16

Photoresist Preparation and Lithographic Processing at 157 nm

In each of Examples 14-16, photoresist compositions were prepared by admixing the following components in the following amounts:

| Component | Amount |
| --- | --- |
| Polymer | 7.58 wt. % of formulation |
| Photoacid generator | 5.2 wt. % of polymer |
| Basic additive | 0.24 wt. % of polymer |
| Surfactant | 0.1 wt. % of polymer |
| Solvent | to provide 92 wt. % fluid formulation |

In each of the photoresist of Examples 14-16, the photoacid generator was triphenyl sulfonium perfluorobutanesulfonate; the basic additive was tetrabutylammonium lactate; the surfactant was R-08 (commercial name MEGAFAC R-08, a fluoroacrylate ester copolymer); and the solvent was 2-heptanone. The polymer component for each resist is specified immediately below. In the below polymer structures, the numbers next each unit designate the mole percent of that repeat unit in the polymer, based on total polymer units. The 157 nm absorbance below is that of the photoresist containing the shown polymer Polymer of Example 14

$Abs_{157}$/um: 1.64

Polymer of Example 15

Mw3666

Abs$_{157}$/um: 1.47

Polymer of Example 16

Mw: 3649

Abs$_{157}$/um: 1.5

Figure 1:
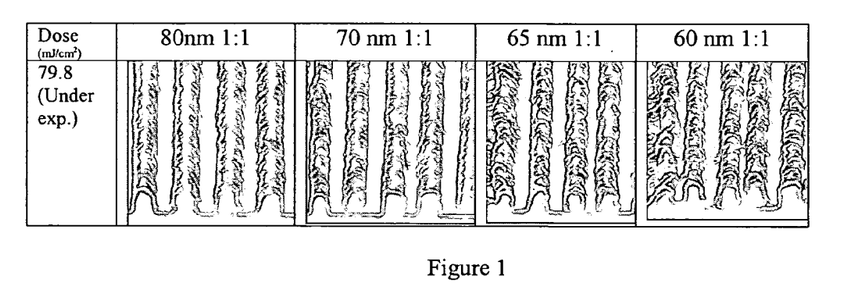
FIG. 1 shows a scanning electron micrograph of a resist relief image produced in Example 14 which follows.

The photoresists of Examples 14-16 were processed as follows. The formulated resists was spin-coated onto a silicon wafer over an organic polymer layer. The underlying organic layer was 1180 Å and had been crosslinked by curing at 215° C. for 90 seconds. The applied resist coating layer had a thickness of 1100Å, was soft-baked at 125° C. for 60 seconds and then exposed through a photomask with 157 nm radiation using an Exitech 0.68 NA scanner. The imaged resist layer was post-exposure baked at 105° C. for 60 seconds and then developed by treated with 0.26N aqueous alkaline developer for 60 seconds to provide a resist relief images. Various size features were printed, including sub-0.1 micron lines and spaces. In FIG. 1, developed lines and spaces of specified dimensions produced with the photoresist of Example 14 are shown.

Example 17

Preparation of Further Photoresist Composition

A photoresist composition is prepared by admixing the following components in the following amounts:

| Component | Amount |
| --- | --- |
| Ti polymer as prepared in Example 13 | 7.58 wt. % of formulation |
| Photoacid generator | 5.2 wt. % of polymer |
| Basic additive | 0.24 wt. % of polymer |
| Surfactant | 0.1 wt. % of polymer |
| Solvent | to provide 92 wt. % fluid formulation |

In that formulation, the photoacid generator is triphenyl sulfonium perfluorobutanesulfonate; the basic additive is tetrabutylammonium lactate; the surfactant is R-08 (commercial name MEGAFAC R-08, a fluoroacrylate ester copolymer); and the solvent is 2-heptanone.

The formulated resist is spin-coated onto a silicon wafer over an organic polymer layer. The underlying organic layer is previously crosslinked by curing at 215° C. for 90 seconds. The applied resist coating layer is soft-baked at 125° C. for 60 seconds and then exposed through a photomask with 193 nm radiation. The imaged resist layer is post-exposure baked at 105° C. for 60 seconds and then developed by treatment with 0.26N aqueous alkaline developer for 60 seconds.

Example 18

Photo-imageable Silicon Containing Polymeric Particle

To a 100 ml 3 neck round bottom flask equipped with a thermometer, condenser, nitrogen inlet, magnetic stirrer and oil bath was charged with 2.0 g (5.6 mmol) of EOM-BTHB-triethoxysilane, 3.9 g of (13.1 mmol) of BTHB-triethoxysilane, 3.32 g (16.0 mmol) of TEOS, 2.0 g (111 mmol) of water, 8 g of propylene glycol methyl ether acetate(PGMEA), 7 g of acetone, and 0.05 g (0.9 mmol) of KOH. The reaction mixture was allowed to reflux at 120° C. for 12 hrs. After the reaction was complete, the polymerization mixture was concentrated by evaporation to remove the acetone. The concentrated mixture was diluted with ethyl acetate and the solution was washed several times with water. The organic mixture was then evaporated to remove the ethyl acetate and then distilled under vacuum to remove PGMEA and residual water. During the distillation, fresh PGMEA was added time to time to further remove residual water. After several times of adding fresh PGMEA, the distillation was stopped when the organic phase had reached a viscosity suitable for precipitation. The polymer was precipitated into n-hexane and dried at 80° C. for 24 hrs in vacuo. (yield 4.48 g (94%). (GPC Mw=7400, Mw/Mn=1.05) (Elemental analysis(%): calc. Si =15.7, F=34.6, C=25.1/ exp. Si=18.67, F=30.16, C=21.08). A Tg was not observed.

Example 19

Gel permeation chromatograph, GPC, (top chromatogram in FIG. 2) and matrix assisted laser desorption ionization time of flight mass spectroscopy, MALDITOF-MS, (bottom spectra) of the silicon containing particle of Example 18 were determined. In a separate experiment SEC of three polymethacrylate standards was used to establish a radius of giration, Rg, of 2.7 nm for the particle. The MALDITOF-MS spectra clearly shows the particle to be a single molecule with a Mn of 24,500 Da. Since GPC is a measure of the hydrodynamic volume of the particle while MS measures the actual mass the two measurements indicate the particle to very dense as expected from a highly cross-linked matter. Monodispersity of this type was also obtained when triethylamine was used as the base catalyst. The GPC and mass spectra obtained in this example are set forth in FIG. 2 of the drawings.

Example 20

Silicon Rich Copolymer Particle

To a 100 ml 3 neck round bottom flask equipped with a thermometer, condenser, nitrogen inlet, magnetic stirrer and oil bath was charged with 10.0 g (33.8 mmol) of BTHB-triethoxysilane, 6.0 g (28.8 mmol) of TEOS, 3.0 g (167 mmol) of water, 10 g of PGMEA, 15 g of acetone, and 0.075 g (1.35 mmol) of KOH. The reaction mixture was allowed reflux at 120° C. for 12 hrs. After this reaction time, acetone was remove by evaporation and the polymerization mixture diluted with ethyl acetate. The solution was washed with several portions of water to remove the base. The product mixture was concentrated by evaporation then subjected to vacuum distillation to remove residual solvents and water. During the distillation, fresh PGMEA was added time to time to further remove residual water. After several additions of fresh PGMEA, distillation was stopped when the organic phase obtained a viscosity appropriate for precipitation. The polymer was precipitated into n-hexane and dried at 80° C. for 24 hrs in vacuo (yield 7.27 g (91%)). (Mw=6920, Mw/Mn=1.06).

Example 21

Terpolymer With Tertiary Butyl Acetate Acid Sensitive Group

To a 100 ml 3 neck round bottom flask equipped with a thermometer, condenser, nitrogen inlet, magnetic stirrer and oil bath was charged with 2.0 g (4.88 mmol) of t-BAC-BTHB-triethoxysilane, 1.44 g of (4.88 mmol) of BTHB-triethoxysilane, 1.35 g (6.50 mmol) of TEOS, 1.0 g (55.5 mmol) of water, 5 g of PGMEA, 6 g of acetone, and 0.3 g (3 mmol) of TEA. The reaction mixture was allowed to reflux at 110° C. for 12 hrs. After this reaction time, the polymerization mixture was removed of acetone by evaporation and then distilled under vacuum to remove PGMEA and residual water. During the distillation, fresh PGMEA was added time to time to further remove residual water. After adding several portions of fresh PGMEA the distillation was stopped when the organic phase had obtained a viscosity suitable for precipitation. The polymer was precipitated into n-hexane and dried at 80° C. for 24 hrs in vacuo (yield 2.4 g (87%); Mw=6000, Mw/Mn=1.1 1). When this synthesis is carried out using a strong inorganic base according to method of Example 18 a particle with a Mw of 2,388 Da. and a Mw/Mn of 1.02 was produced.

Example 22

Acid-promoted Synthesis (Monomers of Example 20)

To a 100 ml 3 neck round bottom flask equipped with a thermometer, condenser, nitrogen inlet, magnetic stirrer and oil bath was charged with 5.0 g (16.9 mmol) of BTHB-triethoxysilane, 3.0 g (14.4 mmol) of TEOS, 3.1 g of water, 1.6 g of ethanol, and 3 ppm of concentrated hydrochloric acid. The reaction mixture was allowed to reflux for 4hrs. The polymerization mixture was then diluted with ethyl acetate and washed with several portions of water until the acid was removed. Neutralization of the acid with base followed with water wash can also be used to remove the acid without affecting the polymer. The polymer solution was evaporated under reduced pressure (aspirator vacuum) at room temperature for 30 min. then placed under vacuum (2 mmHg at room temperature) for an additional 24 hrs. (Yield 88% 3.51 g) (Mw=6700, Mw/Mn=1.39).

Example 23

Post Reaction on Polymer of Example 22 With Tertiary Butyl Bromoacetate

To a 100 ml 3 neck round bottom flask equipped with a thermometer, condenser, nitrogen inlet, magnetic stirrer and oil bath was charged with 4.93 g (35.8 mmol) of $K_2CO_3$, 30 g of acetone, and 3.0 g of polymer of Example 22. The reaction mixture was stirred for 30 min at room temperature then 6.96 g (35.8 mmol) of t-butyl bromoacetate was slowly added over a 1hr period. The reaction mixture was allowed to reflux for 4 days. After this period, the reaction mixture was evaporated to remove the acetone and then diluted with ethyl acetate. This solution was then washed with several portions of water to remove the water soluble salts. The resulting polymer solution was concentration using reduced pressure and further dried at 80° C. for 24 hrs in vacuo [yield 4.75 g (95%); Mw=6140, Mw/Mn=1.22).

Example 24

Photoresist Preparation and Lithographic Processing at 193 nm Using Polymer According to Example 17.

A photoresist composition was prepared as follows. A homogeneous resist solution was obtained by mixing 91 parts of the Si polymer prepared according to Example 17, 4.5 parts of triphenylsulfonium perfluorobutanesulfonate, 0.4 parts of a diamine organosilane and 580 parts of 2-heptanone.

This photoresist was processed as follows. The formulated resist was spin-coated onto an 8-inch silicon wafer over an organic polymer layer. The underlying organic layer was 825 Å and had been crosslinked by curing at 215° C. for 90 seconds. The applied resist coating layer had a thickness of 1100Å, was soft-baked at 125° C. for 60 seconds and then exposed through a photomask with 193 nm radiation. The imaged resist layer was post-exposure baked at 110° C. for 60 seconds and then developed by treated with 0.26N aqueous alkaline developer for 60 seconds to provide a resist relied image.

The invention has been described in detail with reference to particular embodiments thereof. However, it will be appreciated that those skilled in the art, upon consideration of this disclosure, may make modifications and improvements within the spirit and scope of the invention.

What is claimed is:

1. A positive-acting photoimageable composition comprising a photoactive component and a polymer component,
   the polymer component comprising a polymer consisting of a total of two or three distinct repeat units and containing repeat units of the following formula:

wherein R is hydrogen or a non-hydrogvn substituent; and m and n are each greater than zero,
   and wherein the polymer comprises photoacid labile groups or fluorinated alcohol groups and at least 20 percent of total polymer units are $SiO_2$.

2. The photoimageable composition of claim 1 wherein the polymer consists of three distinct repeat units and contains repeat units of the following formula:

wherein $R^1$ and $R^2$ are different and may be hydrogen or a non-hydrogcn substituent, with at least one of $R^1$ and $R^2$ being other than hydrogen; and x, y and z are each greater than zero.

3. The photoimageable composition of claim 1 wherein the photoactive component comprises one or more photoacid generator compounds.

4. The photoimageable composition of claim 1 wherein the polymer comprises photoacid labile groups.

5. The photoimageable composition of claim 1 wherein the polymer comprises fluorinated alcohol groups.

6. The photoimageable composition of claim 1 wherein the polymer comprises carbon atoms.

7. An article of manufacture comprising a substrate comprising a coating layer of a positive-acting photoimageablc composition of claim 1.

8. The photoimageable composition of claim 1 wherein the polymer comprises photoacid-labile ester groups.

9. The photoimageable composition of claim 1 wherein the polymer comprises photoacid-labile acetal groups.

10. The photoimageable composition of claim 1 wherein the polymer consists of a total of two distinct repeat units.

11. The photoimageable composition of claim 1 wherein the polymer consists of a total of three distinct repeat units.

12. A coated substrate comprising:
   a) an underlying organic polymer composition coating layer applied over a substrate surface;
   b) a coating layer of a positive-acting photoimageable composition of claim 1 disposed over the underlying polymer composition coating layer.

13. A method for forming an electronic device, comprising:
   (a) applying a positive-acting photoimageable composition of claim 1 on a substrate;
   (b) exposing the photoimagable composition coating layer to activating radiation and developing the exposed photoimageble layer.

14. A positive-acting photoimageable composition comprising a photoactive component and a polymer component, wherein the polymer consists of repeat units of the following formula:

wherein $R^1$ and $R^2$ are different and may be hydrogen or a non-hydrogen substituent, with at least one of $R^1$ and $R^2$ being other than hydrogen; and x, y and z are each greater than zero,
   wherein the polymer comprises photoacid labile groups or fluorinated alcohol groups; and at least 20 percent of total polymers units of the polymers are $SiO_2$.

15. A positive-acting photoimageable composition comprising a photoactive component and a polymer component,
   the polymer component comprising a poylmer that comprises (1) fluorinated alcohol groups and (2) repeat units of the following formula:

wherein R is hydrogen or a non-hydrogen substituent; and m and n are each greater than zero; and at least 20 percent of total polymers units of the polymers are $SiO_2$.

16. A positive-acting photoimageable composition comprising a photoactive component and a polymer component,
   the polymer component comprising a polymer that comprises repeat units of the following formula:

wherein R is a non-hydrogen substituent; and m and n are each greater than zero; and
   wherein (1) the polymer comprises photoacid labile groups or fluorinated alcohol groups and (2) the polymer consists of a total of two distinct repeat units.

* * * * *